United States Patent
Liu et al.

(10) Patent No.: US 12,433,136 B2
(45) Date of Patent: Sep. 30, 2025

(54) FLEXIBLE DISPLAY APPARATUS AND METHOD FOR MANUFACTURING THE SAME

(71) Applicant: BOE TECHNOLOGY GROUP CO., LTD., Beijing (CN)

(72) Inventors: Lu Liu, Beijing (CN); Shiming Shi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 612 days.

(21) Appl. No.: 17/763,358

(22) PCT Filed: May 19, 2021

(86) PCT No.: PCT/CN2021/094547
§ 371 (c)(1),
(2) Date: Mar. 24, 2022

(87) PCT Pub. No.: WO2021/238731
PCT Pub. Date: Dec. 2, 2021

(65) Prior Publication Data
US 2022/0336775 A1  Oct. 20, 2022

(30) Foreign Application Priority Data
May 28, 2020  (CN) .................... 202010468954.0

(51) Int. Cl.
*H10K 50/844* (2023.01)
*H10K 59/12* (2023.01)
(Continued)

(52) U.S. Cl.
CPC ......... *H10K 59/873* (2023.02); *H10K 50/844* (2023.02); *H10K 71/00* (2023.02); *H10K 59/12* (2023.02); *H10K 2102/311* (2023.02)

(58) Field of Classification Search
None
See application file for complete search history.

(56) References Cited

U.S. PATENT DOCUMENTS

2003/0203210 A1* 10/2003 Graff .................... H10K 77/111
                                                    428/412
2011/0132449 A1*  6/2011 Ramadas ............. H10K 59/871
                                                    428/419
(Continued)

FOREIGN PATENT DOCUMENTS

CN        204087714 U     1/2015
CN        107507846 A    12/2017
(Continued)

OTHER PUBLICATIONS

English translation of JI2016074165A (Year: 2016).*
China Patent Office, CN202010468954.0 First Office Action issued on Jan. 6, 2022.

*Primary Examiner* — Xiaoming Liu
(74) *Attorney, Agent, or Firm* — HOUTTEMAN LAW LLC

(57) ABSTRACT

The present disclosure provides a flexible display apparatus and a method for manufacturing the same. The flexible display apparatus includes a display device and a flexible cover plate disposed on a light emergent side of the display device; a first support layer is provided between the flexible cover plate and the display device, the first support layer includes at least one organic material layer and at least one inorganic material layer. The flexible display apparatus and the method for manufacturing the same can improve the pencil hardness of the whole module to a certain extent.

18 Claims, 3 Drawing Sheets

(51) Int. Cl.
   *H10K 59/80* (2023.01)
   *H10K 71/00* (2023.01)
   *H10K 102/00* (2023.01)

(56) References Cited

U.S. PATENT DOCUMENTS

| | | | |
|---|---|---|---|
| 2014/0077692 A1* | 3/2014 | Lee | H05B 33/10 |
| | | | 445/25 |
| 2014/0264196 A1* | 9/2014 | Werner | C23C 16/30 |
| | | | 977/774 |
| 2017/0018737 A1* | 1/2017 | Kim | H10K 59/8731 |
| 2018/0196169 A1* | 7/2018 | Choi | G02F 1/133 |
| 2018/0337354 A1* | 11/2018 | Sonoda | H10K 59/40 |
| 2019/0140197 A1 | 5/2019 | Zhao | |
| 2019/0165315 A1* | 5/2019 | Li | H10K 59/874 |

FOREIGN PATENT DOCUMENTS

| | | |
|---|---|---|
| CN | 207818084 U | 9/2018 |
| CN | 108615821 A | 10/2018 |
| CN | 208622357 U | 3/2019 |
| CN | 110571251 A | 12/2019 |
| CN | 111599844 A | 8/2020 |

* cited by examiner

FLEXIBLE DISPLAY APPARATUS AND METHOD FOR MANUFACTURING THE SAME

CROSS REFERENCE TO RELATED APPLICATIONS

The present application claims the priority to Chinese patent application No. 202010468954.0, filed at the Chinese Intellectual Property Office on May 28, 2020, the disclosure of which is incorporated herein by reference in its entirety.

TECHNICAL FIELD

The present disclosure relates to the field of display technology, and in particular, to a flexible display apparatus and a method for manufacturing the same.

BACKGROUND

With the development of flexible display technology, application forms such as fixed-curvature curved screens, foldable screens, wrist bands and rollable screens emerge one after another, which inject new vitality into the design of flexible display screens.

Inward-bending technology requires a relatively small bending radius, and a machine carrying an inward-bending foldable screen may also carry an auxiliary screen on an outer surface thereof for convenient and simple display and quickly receiving and making calls. The inward-bending technology has a relatively low requirement on the rigidity of the foldable screen, but has a relative high requirement on the bending radius, and a range from R1 mm to R3 mm (i.e., the bending radius R ranging from 1 mm to 3 mm) is relatively attractive for the industry design (ID design) of the whole machine.

An outward-bendable display module means that a display surface of a flexible display module can be bent outwards, and a flexible cover plate of the flexible display module is exposed outside, resulting in that the whole machine is elegant and beautiful. However, the requirements on the rigidity and the shock resistance of the flexible cover plate are relatively high, so as to prevent a key from scratching the display module or make an impact on the display module invalid.

SUMMARY

An embodiment of the present disclosure provides a flexible display apparatus, which includes a display device and a flexible cover plate disposed at a light emergent side of the display device; a first support layer is provided between the flexible cover plate and the display device, and the first support layer includes at least one organic material layer and at least one inorganic material layer.

In some implementations, the first support layer includes a composite film layer composed of the organic material layer and the inorganic material layer, and a thickness of the organic material layer in the composite film layer is 3 to 5 times a thickness of the inorganic material layer in the composite film layer.

In some implementations, the first support layer includes at least two composite film layers.

In some implementations, the composite film layers of the first support layer are in a number ranging from five to twenty-five.

In some implementations, the composite film layers of the first support layer are in a number ranging from ten to fifteen.

In some implementations, the organic material layer has a thickness ranging from about 1.5 μm to about 7.5 μm.

In some implementations, the inorganic material layer has a thickness ranging from about 0.5 μm to about 1.5 μm.

In some implementations, a material of the organic material layer includes methacrylate, epoxy resin, or carbon-based polycarbonate.

In some implementations, a material of the inorganic material layer includes $SiN_x$ or $SiO_x$.

In some implementations, the inorganic material layer is a stacked layer composed of a material layer made of $SiN_x$ and a material layer made of $SiO_x$.

In some implementations, the flexible display apparatus further includes a connection layer disposed between the first support layer and the display device.

In some implementations, the flexible display apparatus further includes a second support layer provided on a side of the display device away from the first support layer, the second support layer including a back film and a stainless steel layer.

In some implementations, the back film is disposed between the display device and the stainless steel layer.

In some implementations, the back film includes a plastic film and an adhesive layer.

In some implementations, a material of the plastic film includes a material of polyethylene terephthalate (PET), Polyimide (PI), or Polyethylene naphthalate (PEN).

In some implementations, the plastic film has a thickness ranging from about 10 μm to about 100 μm.

In some implementations, the adhesive layer has a thickness ranging from about 10 μm to about 50 μm In some implementations, the flexible display apparatus further includes a hard coating layer disposed on a light emergent side of the flexible cover plate.

In some implementations, a material of the hard coating layer includes an organic material.

In some implementations, the organic material includes a methacrylate material.

In some implementations, the hard coating layer is formed of an organic material doped with an inorganic substance, the organic material is a methacrylate material, and a doping concentration of the inorganic substance in the methacrylate material is less than or equal to 50%.

An embodiment of the present disclosure provides a method for manufacturing a flexible display apparatus, including:
  forming a display device;
  forming a flexible cover plate;
  forming a first support layer on a surface of the flexible cover plate on a light emergent side thereof;
  connecting the flexible cover plate formed with the first support layer with the display device, where the flexible cover plate is disposed on a light emergent side of the display device; and
  where the first support layer includes at least one organic material layer and at least one inorganic material layer.

In some implementations, the method further includes at least one of the following steps:
  forming a connection layer on the first support layer to connect the flexible cover plate formed with the first support layer with the display device;
  forming a second support layer on the display device, where the second support layer is provided on a light incidence side of the display device; or forming a hard coating layer on the flexible cover plate, where the hard coating layer is provided on the light emergent side of the flexible cover plate.

As can be seen from the foregoing, in the flexible display apparatus and the method for manufacturing the same provided by the embodiments of the present disclosure, a composite structure composed of an inorganic layer and an organic layer is provided between the flexible cover plate and the display device to provide support for the flexible cover plate, so that the pencil hardness of the whole module is improved, and the impact resistance of the flexible display apparatus is also improved.

DRAWINGS

In order to more clearly illustrate the embodiments of the present disclosure or the technical solutions in the related art, the drawings used in the description of the embodiments or the related art will be briefly described below, it is obvious that the drawings in the following description are only for illustrating some implementations of the present disclosure, and other drawings can be obtained by those skilled in the art without creative efforts.

DETAILED DESCRIPTION

To make the objects, technical solutions and advantages of the present disclosure more apparent, the present disclosure will be described in further detail below with reference to specific implementations and the accompanying drawings.

It is to be noted that, unless otherwise defined, technical terms or scientific terms used in the embodiments of the present disclosure should have a general meaning as understood by one having ordinary skill in the art to which the present disclosure belongs.

The use of "first," "second," and the like in the present disclosure is not intended to indicate any order, quantity, or importance, but rather is used to distinguish one element from another. The word "include" or "comprise", and the like, means that the element or item preceding the word contains the element or item listed after the word and its equivalent, but does not exclude other elements or items. The terms "connect" or "couple" and the like are not restricted to physical or mechanical connections, but may include electrical connections, whether direct or indirect. Terms "On", "under", "left", "right", and the like are used only to indicate relative positional relationships, and when the absolute position of the object being described is changed, the relative positional relationships may be changed accordingly.

In the related art, in a process of the flexible display apparatus being bent, a dislocation may occur between functional layers of the flexible display apparatus, a transparent adhesive is usually used as a connection layer (for bonding two functional layers together) and a stress release layer, and the stress release layer requires the adhesive to have a certain thickness while having a relatively low modulus, so as to provide sufficient capability for accepting the dislocation and releasing stress. However, the addition of the connection layer with a relatively low modulus and a relatively large thickness is equivalent to providing a soft support under the flexible cover plate, so that the pencil hardness of the flexible cover plate is reduced, and generally, the hardness of the module (MDL) may be reduced by four to six levels compared with the flexible cover plate being in a single layer.

Figure 1:
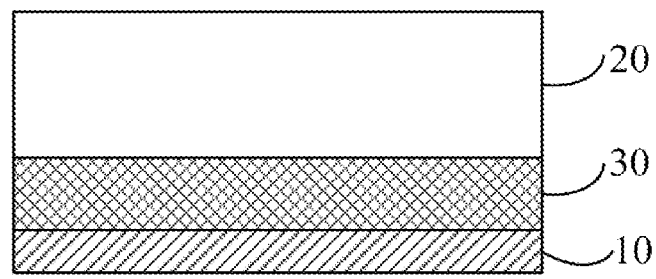
FIG. 1 is a schematic structural diagram of an implementation of a flexible display apparatus according to an embodiment of the present disclosure.

FIG. 1 shows a schematic structural diagram of an implementation of a flexible display apparatus according to an embodiment of the present disclosure.

As shown in FIG. 1, the flexible display apparatus includes a display device 10 and a flexible cover plate 20 disposed on a light emergent side of the display device 10; a first support layer 30 is disposed between the flexible cover plate 20 and the display device 10, the first support layer 30 including at least one organic material layer 31 and at least one inorganic material layer 32.

The organic material layer 31 serves to planarize and balance stress, and the inorganic material layer 32 serves to provide support.

In some implementations, the organic material layer 31 may be made of methacrylate, epoxy resin, carbon-based polycarbonate, or the like; the inorganic material layer 32 may be made of silicon carbide ($SiN_x$) or silicon oxide ($SiO_x$), and, the inorganic material layer 32 may be a stacked structure formed by stacking film layers made of $SiN_x$ and film layers made of $SiO_x$ in a certain quantitative proportion, so as to further increase strength. In the embodiment, the quantitative proportion of the film layers made of $SiN_x$ to the film layers made of $SiO_x$ is not limited, and may be set as desired.

It should be noted that, the display apparatus in the embodiment may be any product or component with a display function, such as electronic paper, a mobile phone, a tablet computer, a television, a notebook computer, a digital photo frame, a navigator and the like.

It can be seen from the above embodiment that, in the flexible display apparatus provided in the embodiment of the present disclosure, a composite structure including the inorganic material layers and the organic material layers is provided between the flexible cover plate and the display device, so as to provide support for the flexible cover plate and further improve pencil hardness of the whole module, and meanwhile, the impact resistance of the flexible display apparatus is improved.

In some implementations, the display device 10 may be an active matrix organic light emitting diode display device (AMOLED). In some implementations, the AMOLED display device may be a display device that integrates functions of a touch panel (TP) and a circular polarizer (CPOL) together.

In some implementations, the flexible cover plate (e.g., Cover Film) may be made of transparent Polyimide (PI), polyethylene terephthalate (PET) or any other base material.

Figure 2:
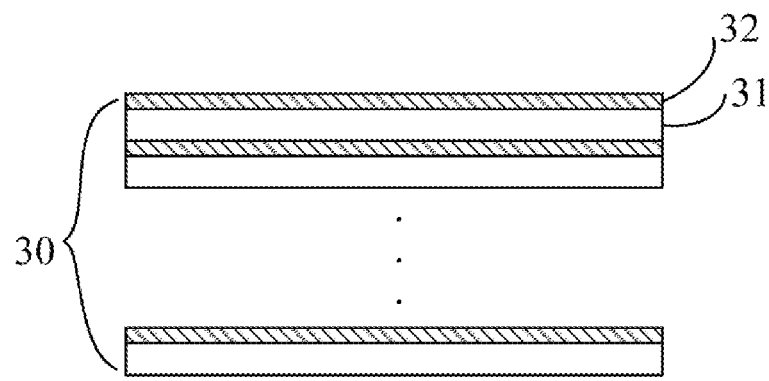
FIG. 2 is a schematic structural diagram of an implementation of a first support layer according to an embodiment of the present disclosure.

Referring to FIG. 2, in one or more implementations of the present disclosure, the first support layer 30 includes a composite film layer formed by the organic material layer 31 and the inorganic material layer 32, and a thickness of the organic material layer 31 in the composite film layer is 3 to 5 times a thickness of the inorganic material layer 32 in the composite film layer. In some implementations, the inorganic material layer has a thickness ranging from about 0.5 μm to about 1.5 μm, and the organic material layer has a thickness ranging from about 1.5 μm to about 7.5 μm.

Generally, the inorganic material layer can provide hardness to support the display device, but the inorganic material layer may be easily broken while being too thick (especially when being bent), which results in reduced flexibility of the flexible display apparatus. Therefore, when the inorganic material layer is used to increase the hardness, the inorganic material layer cannot be made too thick, but the combination of the inorganic material layer and the organic material layer can improve the flexibility to a certain extent. In this way, when hardness is desired to be improved, the stacked structure including the composite film layer composed of the organic material layer 31 and the inorganic material layer 32 may be adopted, so that, on one hand, the hardness is increased by using multiple inorganic material layers, and on the other hand, the problem that the inorganic material layer is too thick and thus easily to be broken can be avoided.

In some implementations, the first support layer 30 includes at least two composite film layers.

In some implementations, the composite film layers of the first support layer 30 are in a number ranging from five to twenty-five.

In some implementations, the composite film layers of the first support layer 30 are in a number ranging from ten to fifteen, which may provide better support and impact resistance.

Figure 3:
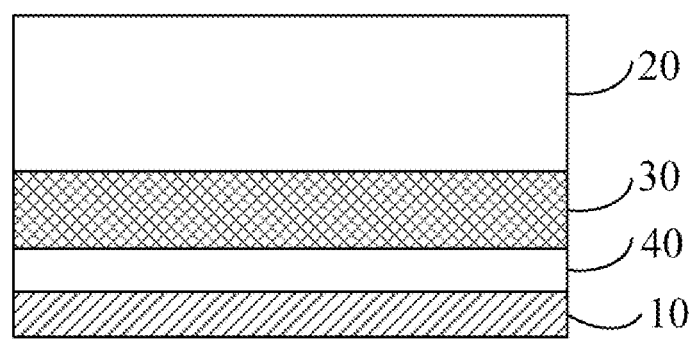
FIG. 3 is a schematic structural diagram of an implementation of a flexible display apparatus according to an embodiment of the present disclosure.

Referring to FIG. 3, in one or more implementations of the present disclosure, a connection layer 40 is further disposed between the first support layer 30 and the display device 10 to attach the display device 10 to the first support layer 30, so as to prevent a dislocation from occurring between the display device 10 and the first support layer 30.

In some implementations, a thickness of the connection layer 40 may be reduced properly based on the stress balance effect provided by the organic material layers in the first support layer 30, for example, the thickness of the connection layer 40 may be selected to range from 25 μm to 50 μm.

Figure 4:
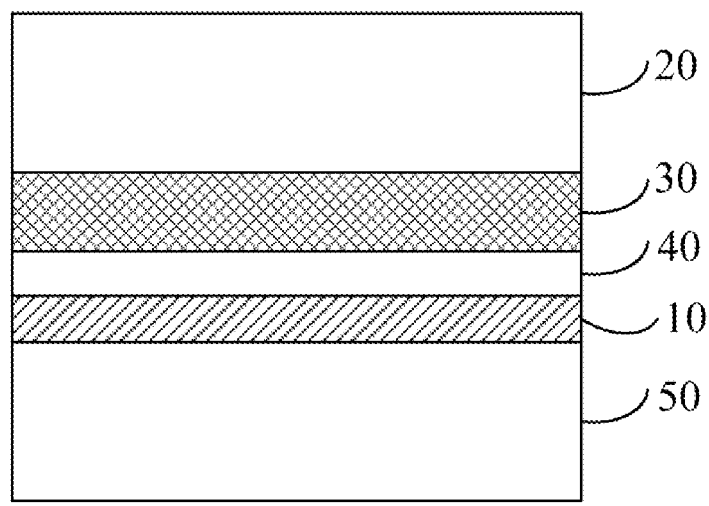
FIG. 4 is a schematic structural diagram of an implementation of a flexible display apparatus according to an embodiment of the present disclosure.

Referring to FIG. 4, in one or more implementations of the present disclosure, the flexible display apparatus further includes a second support layer 50 disposed on a surface of the display device 10 away from the first support layer (i.e., on a light incident side of the display device 10), and the second support layer 50 includes a back film and a stainless steel layer (SUS); where the back film mainly plays a role of protect in the whole process of manufacturing the flexible display apparatus; the SUS may play a role of reducing creases due to its relatively high elastic modulus.

In some implementations, the back film includes a plastic film and an adhesive layer, where the plastic film may be made of PET, PI, polyethylene naphthalate (PEN), and the like; a thickness of the plastic film may range from about 10 μm to about 100 μm, and a thickness of the adhesive layer may range from about 10 μm to about 50 μm. In some implementations, the back film is disposed between the display device 10 and the stainless steel layer.

Figure 5:
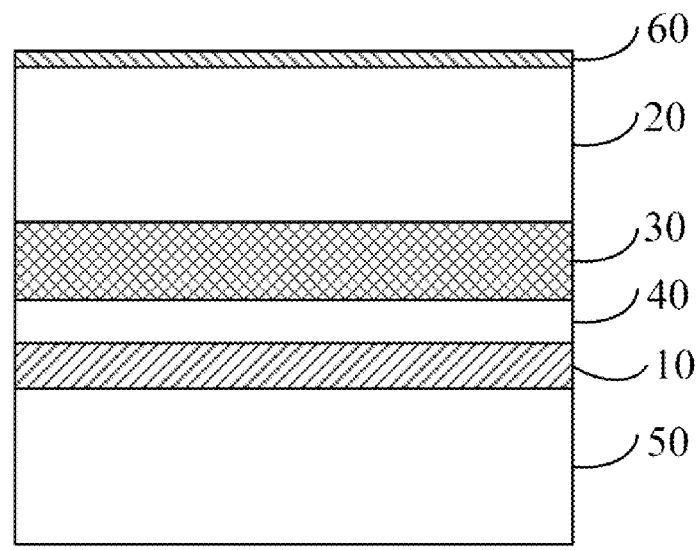
FIG. 5 is a schematic structural diagram of an implementation of a flexible display apparatus according to an embodiment of the present disclosure.

Referring to FIG. 5, in one or more implementations of the present disclosure, a hard coating layer 60 is disposed on a side of the flexible cover plate 20 at the light emergent side to improve pencil hardness of the flexible display apparatus.

In some implementations, the hard coating layer 60 may be made of an organic material such as methacrylate material; the material for manufacturing the hard coating layer 60 may be the methacrylate material doped with inorganic substance, so as to further increase the hardness. In some implementations, a doping concentration of the inorganic substance may be less than or equal to 50%.

Figure 6:
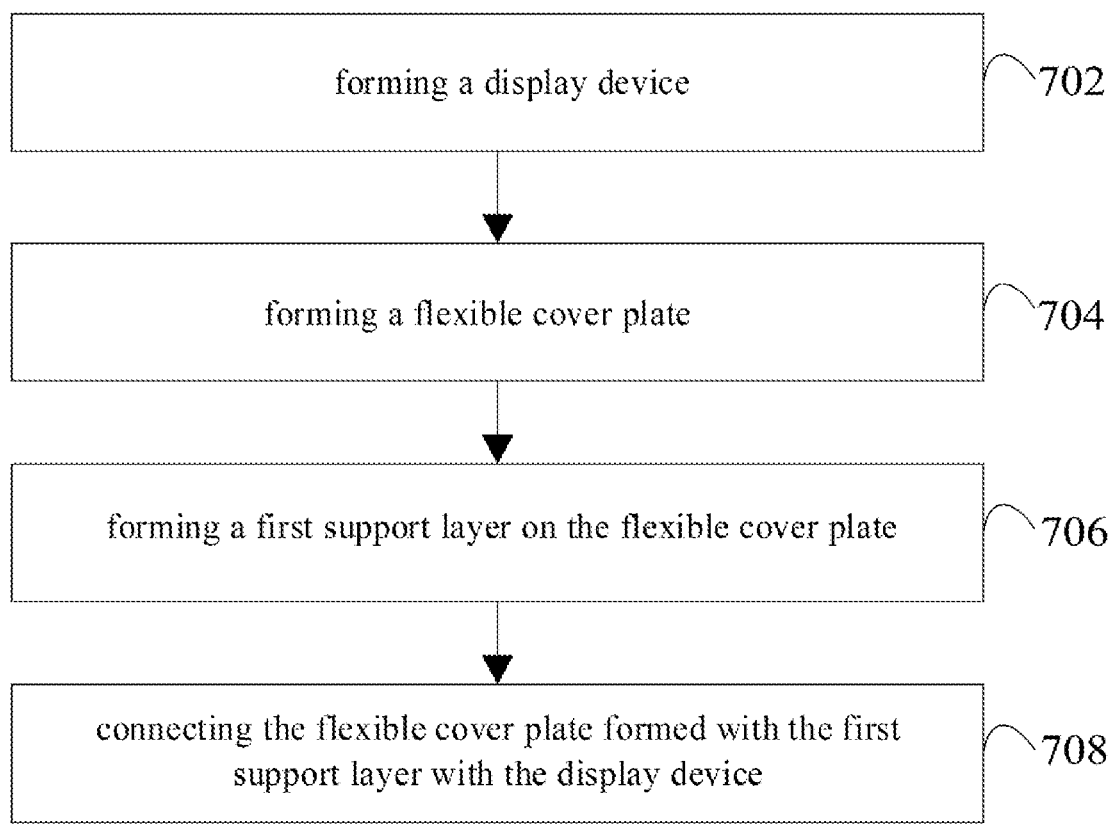
FIG. 6 is a schematic flow chart of a method for manufacturing a flexible display apparatus according to an embodiment of the present disclosure.

FIG. 6 shows a schematic flow chart of a method for manufacturing a flexible display apparatus according to an embodiment of the present disclosure.

As shown in FIG. 6, the method for manufacturing the flexible display apparatus includes:
  a step 702: forming a display device;
  a step 704: forming a flexible cover plate;
  a step 706: forming a first support layer on a surface of the flexible cover plate on a light emergent side of the flexible cover plate; and
  a step 708: connecting the flexible cover plate formed with the first support layer with the display device, the flexible cover plate being disposed on a light emergent side of the display device.

The first support layer includes at least one organic material layer and at least one inorganic material layer.

In some implementations, the inorganic material layer may be manufactured by using a plasma chemical vapor deposition process (PCVD), and the organic material layer may be manufactured by using a process such as a spin coating, printing, or the like.

It can be seen from the foregoing embodiment that, in the method for manufacturing the flexible display apparatus according to the embodiment of the present disclosure, a composite structure of the inorganic layer and the organic layer is provided between the flexible cover plate and the display device to provide support for the flexible cover plate, so that the pencil hardness of the whole module is improved, and the impact resistance of the flexible display apparatus is also improved.

In some implementations, the method for manufacturing further includes at least one of the following steps:
  forming a connection layer on the first support layer to connect the flexible cover plate
  formed with the first support layer with the display device;
  forming a second support layer on the display device, the second support layer being provided on a light incidence side of the display device; or
  forming a hard coating layer on the flexible cover plate, the hard coating layer being provided on the light emergent side of the flexible cover plate.

It should be noted that the operations of forming the layers include, but are not limited to, (chemical phase, physical phase) deposition film formation, (magnetron) sputtering film formation, and those skilled in the art can understand that after each layer is formed, a corresponding pattern may be further formed from the layer as desired, and the description thereof is not repeated herein.

It is noted that in the drawings, the sizes of layers and regions may be exaggerated for clarity of illustration. Also, it will be understood that when an element or layer is referred to as being "on" another element or layer, it may be directly on the another element or intervening layers may also be present. In addition, it will be understood that when an element or layer is referred to as being "under" another element or layer, it can be directly under the another element, or one or more intervening layers or elements may

What is claimed is:

1. A flexible display apparatus, comprising: a display device and a flexible cover plate disposed on a light emergent side of the display device; wherein a first support layer is provided between the flexible cover plate and the display device, and the first support layer comprises at least one organic material layer and at least one inorganic material layer, wherein
the first support layer comprises a composite film layer composed of the organic material layer and the inorganic material layer, and a thickness of the organic material layer in the composite film layer is 3 to 5 times a thickness of the inorganic material layer in the composite film layer, and
the composite film layers of the first support layer are in a number ranging from ten to fifteen.

2. The flexible display apparatus of claim 1, wherein the first support layer comprises at least two composite film layers.

3. The flexible display apparatus of claim 2, wherein the composite film layers of the first support layer are in a number ranging from five to twenty-five.

4. The flexible display apparatus of claim 1, wherein the organic material layer has a thickness ranging from about 1.5 µm to about 7.5 µm.

5. The flexible display apparatus of claim 1, wherein the inorganic material layer has a thickness ranging from about 0.5 µm to about 1.5 µm.

6. The flexible display apparatus of claim 1, wherein a material of the organic material layer comprises methacrylate, epoxy resin or carbon-based polycarbonate.

7. The flexible display apparatus of claim 1, wherein a material of the inorganic material layer comprises SiNx or SiOx.

8. The flexible display apparatus of claim 7, wherein the inorganic material layer is a stacked layer composed of a material layer made of SiNx and a material layer made of SiOx.

9. The flexible display apparatus of claim 1, further comprising a connection layer disposed between the first support layer and the display device.

10. The flexible display apparatus of claim 1, further comprising a second support layer disposed on a side of the display device away from the first support layer, the second support layer comprising a back film and a stainless steel layer, and the back film is disposed between the display device and the stainless steel layer.

11. The flexible display apparatus of claim 10, wherein the back film comprises a plastic film and an adhesive layer.

12. The flexible display apparatus of claim 11, wherein a material of the plastic film comprises PET, PI or PEN and the plastic film has a thickness ranging from about 10 µm to about 100 µm.

13. The flexible display apparatus of claim 11, wherein the adhesive layer has a thickness ranging from about 10 µm to about 50 µm.

14. The flexible display apparatus of claim 1, further comprising a hard coating layer disposed on a light emergent side of the flexible cover plate, and a material of the hard coating layer comprises an organic material.

15. The flexible display apparatus of claim 14, the organic material comprises a methacrylate material.

16. The flexible display apparatus of claim 14, wherein the hard coating layer is formed of an organic material doped with an inorganic substance, the organic material is a methacrylate material, and a doping concentration of the inorganic substance in the methacrylate material is less than or equal to 50%.

17. A method for manufacturing a flexible display apparatus, comprising:
forming a display device;
forming a flexible cover plate;
forming a first support layer on a surface of the flexible cover plate on a light emergent side thereof;
connecting the flexible cover plate formed with the first support layer with the display device, wherein the flexible cover plate is provided on a light emergent side of the display device;
wherein the first support layer comprises at least one organic material layer and at least one inorganic material layer,
the first support layer comprises a composite film layer composed of the organic material layer and the inorganic material layer, and a thickness of the organic material layer in the composite film layer is 3 to 5 times a thickness of the inorganic material layer in the composite film layer, and
the composite film layers of the first support layer are in a number ranging from ten to fifteen.

18. The method of claim 17, further comprises at least one of:
forming a connection layer on the first support layer to connect the flexible cover plate formed with the first support layer with the display device;
forming a second support layer on the display device, the second support layer being disposed on a light incidence side of the display device; or
forming a hard coating layer on the flexible cover plate, the hard coating layer being disposed on the light emergent side of the flexible cover plate.

* * * * *